(12) United States Patent
Master et al.

(10) Patent No.: US 6,367,679 B1
(45) Date of Patent: Apr. 9, 2002

(54) DETECTION OF FLUX RESIDUE

(75) Inventors: Raj N. Master; Jonathan D. Halderman, both of San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/642,831

(22) Filed: Aug. 22, 2000

Related U.S. Application Data
(60) Provisional application No. 60/214,856, filed on Jun. 28, 2000.

(51) Int. Cl.[7] .............................................. B23K 31/12
(52) U.S. Cl. ......................... 228/103; 228/104; 73/71.1
(58) Field of Search ................................ 228/103, 104, 228/180.22; 324/71.1, 71.4, 71.5, 72, 72.5, 76.11

(56) References Cited

U.S. PATENT DOCUMENTS

| | | | |
|---|---|---|---|
| 4,023,931 A | * | 5/1977 | Wolfgram |
| 4,276,186 A | | 6/1981 | Bakos et al. ................. 252/158 |
| 4,530,601 A | | 7/1985 | Tasset |
| 4,731,154 A | | 3/1988 | Hausman Hazlitt et al. |
| 5,246,023 A | * | 9/1993 | Breunsbach et al. |
| 5,922,606 A | | 7/1999 | Jenkins et al. ................. 436/55 |
| 5,932,021 A | | 8/1999 | Cala et al. ..................... 134/2 |
| 5,988,485 A | | 11/1999 | Master et al. |
| 6,039,805 A | | 3/2000 | Davis et al. .................. 118/74 |
| 6,059,894 A | | 5/2000 | Pendse ......................... 148/23 |

OTHER PUBLICATIONS

Derwent (1985–254471).*

* cited by examiner

*Primary Examiner*—Tom Dunn
*Assistant Examiner*—Kiley Stoner

(57) ABSTRACT

Detection of flux residue remaining the formation of a device/substrate assembly is carried out by contacting the assembly with a fixed amount of solvent adapted to remove residual flux from the assembly and measuring the conductivity or resistance of the contacted solvent to determine the presence of flux residue in the solvent obtained from the assembly. Embodiments include contacting the assembly with isopropanol by immersing and withdrawing the assembly in a fixed amount of the solvent and measuring the conductivity of the contacted solvent with a volt meter.

10 Claims, No Drawings

DETECTION OF FLUX RESIDUE

RELATED APPLICATION

This application claims priority from the U.S. Provisional Application Ser. No. 60/214,856 filed Jun. 28, 2000 entitled "Detection of Flux Residue" which is hereby incorporated in its entirety by reference herein.

FIELD OF THE INVENTION

The present invention relates generally to semiconductor packaging technology and the manufacture of package assemblies. The present invention has particular applicability to quantitative methods of detecting residual flux in assembled package.

BACKGROUND

Integrated circuit devices are typically electronically packaged by mounting one or more integrated circuit (IC) chips or dies on a substrate, sometimes referred to as a carrier. In a flip chip assembly or package, the die is "bumped" with solder to form a plurality of discrete solder balls over metal contacts on the surface of the die. The chip is then turned upside down or "flipped" so that the device side or face of the IC die can be mounted to a substrate having a corresponding array of metal contacts. Typically, the metal contacts of the substrate are coated with a solder alloy. Electrical interconnection of the die to the substrate is conventionally performed by aligning the die and substrate and reflowing the solder on the die and/or the substrate to electrically and mechanically join the parts. Directly coupling the die immediately below the substrate allows for an increased number of interconnections and improves voltage noise margins and signal speed.

Typically a flux composition is applied to either the die or the substrate to facilitate the formation of the interconnect. Flux acts as an adhesive to hold the components in place pending soldering and further minimizes metallic oxidation that occurs at soldering temperatures thereby improving the electrical and mechanical interconnection and reliability. Soldering fluxes fall into three broad categories: rosin fluxes, water-soluble fluxes, and no-clean fluxes. Rosin fluxes, which have a relatively long history of use and are still widely used in the electronics industry, are generally only moderately corrosive. Water-soluble fluxes, which are a more recent development and which are increasingly used in consumer electronics, are highly corrosive materials. No-clean fluxes, a very recent development, reportedly do not require removal from the circuit assemblies.

It has been observed that controlling the amount of applied flux is important irrespective of the type of flux employed in a particular packaging process, since enough flux must be used to effect a reliable metallurgical bond to electrically and mechanically interconnect the components. However, residues of any flux are believed to cause circuit failure if residual traces of the material are not carefully removed following soldering and, thus, remain on the electronic circuit assembly. Excess flux adversely impacts further circuit board manufacturing processes as, for example, delamination of underfill, leading to circuit failure. Particularly problematic are fluxes having corrosive constituents which, unless removed, will lead to corrosion of the soldered parts. Moreover, certain circuit board assemblers even require the removal of no-clean flux residues from circuit boards. Hence, determinations of flux residue following soldering is important in the fabrication of electronic packages.

Several methods of determining flux residue are known. For example, U.S. Pat. No. 4,530,601 to Tasset discloses a test method for determining residual rosin on cleaned circuit boards by washing the circuit board, adjusting the pH of the washings and then measuring the turbidity of the washings. U.S. Pat. No. 4,731,154 to Hausman et al. discloses a method for determining the organic contaminates remaining on cleaned circuit boards by spectrophotometric. Although the above-described methods provide determinations of flux residues, it is continually desirable to provide improved methods for determining flux residues from assembled electronic circuit packages. In particular, it is desirable to provide convenient and quick methods that can be preformed during high volume production of electronic circuit assembly.

Accordingly, a continual need exists for improved processes and/or assemblies for determining residual flux of electronic packaged components.

SUMMARY OF THE INVENTION

An advantage of the present invention is a convenient, precise and reliable method for determining flux residue.

Additional advantages and features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a process of determining residual flux residue on a device/substrate assembly. The method comprises: contacting the assembly with a solvent adapted to substantially remove flux residue from the assembly; and measuring the conductivity of the solvent to determine the presence of flux residue in the solvent obtained from the assembly. By measuring the conductivity of the solvent to determine flux residue, the present invention advantageously provides a convenient and quick process for determining the amount of residual flux remaining on a packaged assembly that can be practiced during high volume production thereby improving quality control.

Embodiments of the present invention include contacting the assembly with at least one solvent selected from the group consisting of an aromatic, alcohol, ketone, nitrile, amide, amine solvent or mixtures thereof by immersing and withdrawing the assembly in a fixed amount of the solvent and measuring the conductivity of the solvent with a volt meter to determine flux residue as low as 1–5 micrograms per $mm^2$ of the assembly. Precise measurements of flux residue can be attained for any given package by preparing a series of standard solutions having a known amount of flux contained therein to provide a calibration curve relating the quantity of flux to conductivity of the solution and comparing the resultant conductivity of the contacted solvent to determine the amount of flux in the contacted solvent.

The present invention is applicable to the manufacture of packages comprising any device interconnected to a substrate in which flux has been used during the packaging process. In particular, the present invention is applicable to a process of forming a device/substrate assembly by mounting a device having a plurality of solder bumps to a substrate having a corresponding plurality of contact pads coated with flux and then reflowing the solder to form the assembly.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawing and description are to be regarded as illustrative in nature, and not as restrictive.

DESCRIPTION OF THE INVENTION

The present invention is useful in determining the amount or existence of flux residue remaining after soldering an electronic component to a substrate. The present invention conveniently and quickly enables the qualitative and quantitative determinations of residual flux on semiconductor packages, particularly flip chip packages, during high volume production on the floor of the assembly line.

Assembling an integrated device and a substrate in a flip chip configuration typically begins by providing a substrate for mounting a device. The substrate has an array of conductive contacts corresponding to the solder bumps of the device to be mounted and joined thereto and can be made of ceramic, e.g. as in an alumina circuitized substrate, or organic materials. The device can be any device having a solder terminal thereon as, for example, an integrated circuit (IC) made of at least one semiconductor material and having one of a variety of lead-based or lead-free solders on the IC. The invention also contemplates determination of residual flux in the packaging of a resistor, capacitor, inductor, transistor, or any other electronic device in need of packaging and having at least one solder terminal employing a flux process.

Flux is typically applied to either the substrate or the semiconductor device by either brushing or spraying the flux onto the appropriate portion of the substrate or device. The amount of applied flux will depend on the size of the device intended to be interconnected on the substrate, the number of terminals on the device, the type of solder employed, the type of flux employed, etc. Flux can be applied to the portion of the substrate or device in need of fluxing as, for example, over the area where a solder interconnection is to be made. Such preselected areas on the substrate are generally referred to in the art as the chip pad area. Following assembly of the device and substrate, the assembly is heated to reflow the solder forming an electrical interconnection between the parts.

In accordance with the present invention, residual flux is determined on the interconnected assembly by contacting the assembly with at least one solvent adapted to substantially remove flux residue from the assembly. The solvent is chosen such that substantially all, if not all, of the residual flux on the assembly will be carried away and dissolve in the solvent. Suitable solvents for the present invention include an aromatic, alcohol, ketone, nitrile, amide, amine solvent or mixtures thereof. In an embodiment of the present invention, the assembly is contacted with at least one of: acetone; butyl acetate; ethoxyethyl acetate; ethyl benzene; ethylene glycol; isopropanol; methyl ethyl ketone; methyl pyrrolidone; tetramethyl ammonium hydroxide; xylene; sulfonates; carboxylates; phosphates; poly(oxyethylene) alcohols; betaines; and dioctylphthalates. The type of solvent depends on the particular flux employed and to a lesser extent on the manner in which the solvent is contacted with the assembly.

In practicing the invention, the soldered assembly is contacted with solvent to substantially remove any residual flux thereon. The assembly can be contacted by spraying the assembly with a fixed amount of the solvent or by submerging the assembly in a fixed amount of the solvent, or by any other convenient method that allows the solvent to contact the assembly for removal of flux residue. In an embodiment of the present invention, a ceramic ball grid array/IC flip chip soldered assembly is formed with a no-clean flux, such as TAC 10 available from Indium Corporation (based in Utica, N.Y.). The assembly is soaked in just enough isopropyl alcohol solvent to wick under the chip. The assembly is soaked for approximately 5 minutes, while maintaining a fixed amount of solvent under the chip. The soldered assembly is then rinsed with about 10 ml of the isopropyl alcohol and the solvent collected in a glass container.

After contacting the solvent with the soldered assembly, the conductivity of the contacted solvent is measured as by a conventional volt meter to determine the presence of flux residue in the solvent obtained from the assembly. Qualitative determinations of the amount of residual flux in the solvent can be made by comparing standard solutions free of flux. For example, qualitative determinations can be made by the comparison of the conductivity of the contacted solvent to the conductivity of the same amount of the same solvent prior to contacting the solvent with the assembly. The organic solvents employed in accordance with the present invention typically have a low resistance in their unadulterated form due to the lack of charge carriers contained in the solvent. When the solvent includes flux, however, the resistance of the solvent is modified according to the amount of flux present.

To provide a more accurate quantitative analysis of residual flux on a particular package, the conductivity of a contacted solvent can be compared to the conductivity of a solvent prepared by contacting an identical assembly made without flux. Thus, any impurities other than flux that would effect the conductivity measurements would be normalized in the comparison. The conductivity of the solvent determined before contacting the solvent with the assembly and after contact with the assembly can provide a quantitative determination of the amount of flux that has been dissolved in the solvent. By measuring the conductivity of the solvent to determine flux residue, the present invention advantageously provides a convenient and quick process for high volume production of packaging electronic components away from the research laboratory, i.e. on the fabrication line.

Precise measurements of flux residue can be attained for any given package by preparing a series of standard solutions having a known amount of flux contained therein to provide a calibration curve relating the quantity of flux to the conductivity of the solution. Comparing the resultant conductivity of the contacted solvent to the prepared calibration curve enables the quantitative determination of the amount of residual flux removed from the assembly in the range of approximately tens and hundreds of nanograms of flux per ml of solvent.

In an embodiment of the present invention, a calibration curve was prepared by relating the resistance of different solutions prepared with different amounts of flux. In one such solution a fixed quantity of TAC 10 flux was dissolved in one liter of isopropanol and the resistance of the solution was measured using a convention four-point resistance measurement system. Several successively diluted solutions were prepared from the original solution and their resistance also measured. By comparing a test solution to the calibration curve, quantitative amounts of residual flux can be determined.

In practicing the present invention, an assembly comprising a flip chip die having high lead solder bumps, e.g. about 97–97 wt. % lead/3–5 wt. % tin, and a ceramic, e.g. an alumina substrate having a plurality of solder pads formed of eutectic solder alloy on the face thereof is formed. The assembly is formed by applying flux, such TAC 10 flux, in the chip pad area of the substrate and then placing the die on the substrate. The assembly is then heated to reflow the solder in a reflow oven set at a temperature from about 180–270° C. to form an interconnected device/substrate assembly. In an embodiment of the present invention, the assembly is then contacted with isopropanol by submerging the interconnected assembly in a container holding the solvent for a sufficient amount of time such that any residual flux on the assembly is removed by the solvent. The assembly is then withdrawn from the container and the conductivity of the contacted isopropanol solvent is then measured with a conventional volt meter. In practicing the present invention, amounts from about 0.1 to about 25 microgram/$mm^2$ of residual flux over the area of the assembly can determined.

The process steps and structures described above do not form a complete process flow for manufacturing device assemblies or the packaging of integrated semiconductor devices. The present invention can be practiced in conjunction with electronic package fabrication techniques currently used in the art, and only so much of the commonly practiced process steps are included as are necessary for an understanding of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A process of determining residual flux residue on a device/substrate assembly, the process comprising:

forming the device/substrate assembly;

immediately contacting the formed assembly with a solvent adapted to substantially remove flux residue from the assembly; and measuring the conductivity of the solvent after contact with the assembly to quantitatively determine the amount of flux residue in the solvent obtained from the assembly.

2. The process of claim 1 comprising contacting the assembly with at least one solvent selected form the group consisting of an aromatic, alcohol, ketone, nitrile, amide, amine solvent or mixtures thereof.

3. The process of claim 1 comprising measuring the conductivity of the solvent to determine flux residue as low as 1 microgram/$mm^2$.

4. The process of claim 1 comprising contacting the assembly with the solvent by spraying a fixed amount of the solvent on the assembly.

5. The process of claim 1 comprising contacting the assembly with the solvent by immersing and withdrawing the assembly in a fixed amount of the solvent.

6. The process of claim 1 comprising measuring the conductivity of the solvent with a volt meter.

7. The process of claim 1 comprising preparing a series of standard solutions having a known amount of flux contained therein to provide a calibration curve relating the quantity of flux to conductivity and comparing the resultant conductivity of the contacted solvent to determine the amount of flux in the contacted solvent.

8. The process of claim 1 comprising forming the device/substrate assembly by mounting a device having a plurality of solder bumps to a substrate having a corresponding plurality of contact pads coated with flux and then reflowing the solder to form the assembly.

9. The process of claim 8 comprising coating the substrate with a no-clean flux prior to reflow and contacting the assembly with isopropanol solvent after forming the assembly.

10. The process of claim 8 comprising coating the substrate with the flux and reflowing the solder in a reflow oven at a temperature from about 180° C. to about 270° C.

* * * * *